United States Patent
Zhou

(10) Patent No.: US 9,852,943 B2
(45) Date of Patent: Dec. 26, 2017

(54) METHOD FOR MANUFACTURING A CONDUCTOR TO BE USED AS INTERCONNECT MEMBER

(71) Applicant: Semiconductor Manufacturing International (Shanghai) Corporation, Shanghai (CN)

(72) Inventor: Ming Zhou, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 15/221,216

(22) Filed: Jul. 27, 2016

(65) Prior Publication Data
US 2017/0062272 A1    Mar. 2, 2017

(30) Foreign Application Priority Data

Sep. 1, 2015   (CN) .......................... 2015 1 0551706

(51) Int. Cl.
H01L 21/768     (2006.01)
H01L 21/3213    (2006.01)
H01L 21/285     (2006.01)

(52) U.S. Cl.
CPC .... H01L 21/76883 (2013.01); H01L 21/2855 (2013.01); H01L 21/32131 (2013.01); H01L 21/76879 (2013.01)

(58) Field of Classification Search
CPC ................... H01L 21/76879; H01L 21/76883
See application file for complete search history.

(56) References Cited

U.S. PATENT DOCUMENTS

| | | | |
|---|---|---|---|
| 4,140,596 A | 2/1979 | Wobking | |
| 6,210,555 B1 | 4/2001 | Taylor et al. | |
| 6,398,937 B1 | 6/2002 | Menini et al. | |
| 2010/0041226 A1 | 2/2010 | Reid et al. | |

*Primary Examiner* — Yu-Hsi D Sun
(74) *Attorney, Agent, or Firm* — Innovation Counsel LLP

(57) ABSTRACT

A method for manufacturing a conductor may include the following steps: preparing a substrate structure and a first metal set, wherein the substrate structure has a recess, wherein a first portion of the first metal set is positioned at the recess; applying a first electric current and a first ultrasonic wave for dissolving the first portion of the first metal set to obtain a first opening; applying a second electric current and a second ultrasonic wave for depositing a second metal set on the first metal set, wherein a first portion of the second metal set is positioned at a position of the first opening; applying a third electric current and a third ultrasonic wave for dissolving the first portion of the second metal set to obtain a second opening; and providing a third metal set through the second opening into the recess.

20 Claims, 9 Drawing Sheets

METHOD FOR MANUFACTURING A CONDUCTOR TO BE USED AS INTERCONNECT MEMBER

CROSS-REFERENCE TO RELATED APPLICATION

This application claims priority to and benefit of Chinese Patent Application No. 201510551706.1, filed on 1 Sep. 2015; the Chinese Patent Application is incorporated herein by reference in its entirety.

BACKGROUND OF THE INVENTION

The technical field is related to a method for manufacturing a conductor that is to be used as an interconnect member in an integrated circuit.

An integrated circuit may include interconnect members for enabling electrical connections between components. FIG. 1 shows a schematic cross-sectional view that illustrates an interconnect member. A conductive material may be provided into a trench 101 and a via 102 for forming the interconnect member. In the process of providing the conductive material, one or more voids 103 may be enclosed by the conductive material inside the trench 101 and/or the via 102. The void(s) 103 may cause the performance of the interconnect member to be unsatisfactory.

SUMMARY

An embodiment may be related to a method for manufacturing a conductor. The conductor may function as an interconnect member in an integrated circuit and/or a printed circuit board. The method may include the following steps: preparing a substrate structure and a first conductive material set, wherein the substrate structure may have a recess, and wherein a first portion of the first conductive material set may be positioned at the recess; applying a first electric current and a first ultrasonic wave for dissolving the first portion of the first conductive material set to obtain a first opening; applying a second electric current and a second ultrasonic wave for depositing a second conductive material set on the first conductive material set, wherein a first portion of the second conductive material set is positioned at a position of the first opening; applying a third electric current and a third ultrasonic wave for dissolving the first portion of the second conductive material set to obtain a second opening; and providing a third conductive material set through the second opening into the recess.

The method may include the following step: applying a fourth electric current and a fourth ultrasonic wave for depositing the third conductive material set into the recess. The fourth electric current may be identical to the second electric current. The fourth ultrasonic wave may be identical to the second ultrasonic wave.

The method may include the following step: alternately applying electric currents identical to the second electric current and electric currents identical to the third electric current for a plurality of iterations when continuously applying one or more ultrasonic waves identical to at least one of the second ultrasonic wave and the third ultrasonic wave. The number of the iterations may be in a range of 1 and 20.

The first portion of the first conductive material set may be dissolved at a first dissolution rate. The first portion of the second conductive material set may be dissolved at a second dissolution rate. The second dissolution rate may be greater than the first dissolution rate.

When the second electric current and the second ultrasonic wave are applied, a conductive material deposition rate may be greater than a conductive material dissolution rate.

The first portion of the first conductive material set and a second portion of the first conductive material set may be respectfully positioned at two opposite edges of the recess. A gap may exist between the first portion of the first conductive material set and the second portion of the first conductive material set. The first opening may be wider than the gap in a direction parallel to (e.g., a bottom surface of) the substrate structure.

The first portion of the second conductive material set and a second portion of the second conductive material set may be respectfully positioned at two positions that respectively correspond to two opposite edges of the first opening. A gap may exist between the first portion of the second conductive material set and the second portion of the second conductive material set. The second opening may be wider than the gap in a direction parallel to (e.g., a bottom surface of) the substrate structure.

The second ultrasonic wave may continue from the first ultrasonic wave without interruption between the first ultrasonic wave and the second ultrasonic wave.

The third ultrasonic wave may continue from the second ultrasonic wave without interruption between the second ultrasonic wave and the third ultrasonic wave.

At least one of the first ultrasonic wave, the second ultrasonic wave, and the third ultrasonic wave may have a frequency that is in a range of 1000 Hz to 5000 Hz. At least one of the first ultrasonic wave, the second ultrasonic wave, and the third ultrasonic wave may have a power that is in a range of 10 W to 5000 W.

The first electric current and the first ultrasonic wave may be applied for a first time duration. The second electric current and the second ultrasonic wave may be applied for a second time duration. The first time duration may be shorter than the second time duration.

An electric current density of the first electric current may be less than an electric current density of the second electric current.

An electric current density of the second electric current may be greater than an electric current density of the third electric current.

An electric current density of the first electric current may be less than or equal to an electric current density of the third electric current.

An electric current density of the first electric current may be in a range of 0.001 A/cm$^2$ to 5 A/cm$^2$. An electric current density of the second electric current may be in a range of 0.01 A/cm$^2$ to 20 A/cm$^2$. An electric current density of the third electric current may be in a range of 0.001 A/cm$^2$ to 10 A/cm$^2$.

The first electric current may have a first anodic pulse and a first cathodic pulse. The first anodic pulse may have a first anodic pulse width. The first cathodic pulse may have a first cathodic pulse width. A ratio of the first anodic pulse width to the first cathodic pulse width may have a first pulse width ratio value. The second electric current may have a second anodic pulse and a second cathodic pulse. The second anodic pulse may have a second anodic pulse width. The second cathodic pulse may have a second cathodic pulse width. A ratio of the second anodic pulse width to the second cathodic pulse width may have a second pulse width ratio value. The first pulse width ratio value may be greater than the second pulse width ratio value.

The first electric current may have a first anodic pulse and a first cathodic pulse. The first anodic pulse may have a first anodic pulse amplitude. The first cathodic pulse may have a first cathodic pulse amplitude. A ratio of the first anodic pulse amplitude to the first cathodic pulse amplitude may have a first pulse amplitude ratio value. The second electric current may have a second anodic pulse and a second cathodic pulse. The second anodic pulse may have a second anodic pulse amplitude. The second cathodic pulse may have a second cathodic pulse amplitude. A ratio of the second anodic pulse amplitude to the second cathodic pulse amplitude may have a second pulse amplitude ratio value. The first pulse width ratio value may be greater than or equal to the second pulse width ratio value.

The second electric current may have a second anodic pulse and a second cathodic pulse. The second anodic pulse may have a second anodic pulse width. The second cathodic pulse may have a second cathodic pulse width. A ratio of the second anodic pulse width to the second cathodic pulse width may have a first ratio value. The third electric current may have a third anodic pulse and a third cathodic pulse. The third anodic pulse may have a third anodic pulse width. The third cathodic pulse may have a third cathodic pulse width. A ratio of the third anodic pulse width to the third cathodic pulse width may have a second ratio value. The first ratio value may be less than the second ratio value.

The second electric current may have a second anodic pulse and a second cathodic pulse. The second anodic pulse may have a second anodic pulse amplitude. The second cathodic pulse may have a second cathodic pulse amplitude. A ratio of the second anodic pulse amplitude to the second cathodic pulse amplitude may have a first ratio value. The third electric current may have a third anodic pulse and a third cathodic pulse. The third anodic pulse may have a third anodic pulse amplitude. The third cathodic pulse may have a third cathodic pulse amplitude. A ratio of the third anodic pulse amplitude to the third cathodic pulse amplitude may have a second ratio value. The first ratio value may be less than or equal to the second ratio value.

The first electric current may have a first anodic pulse and a first cathodic pulse. The first anodic pulse may have a first anodic pulse width. The first cathodic pulse may have a first cathodic pulse width. A ratio of the first anodic pulse width to the first cathodic pulse width may have a first ratio value. The third electric current may have a third anodic pulse and a third cathodic pulse. The third anodic pulse may have a third anodic pulse width. The third cathodic pulse may have a third cathodic pulse width. A ratio of the third anodic pulse width to the third cathodic pulse width may have a second ratio value. The first ratio value may be equal to the second ratio value.

The first electric current may have a first anodic pulse and a first cathodic pulse. The first anodic pulse may have a first anodic pulse amplitude. The first cathodic pulse may have a first cathodic pulse amplitude. A ratio of the first anodic pulse amplitude to the first cathodic pulse amplitude may have a first ratio value. The third electric current may have a third anodic pulse and a third cathodic pulse. The third anodic pulse may have a third anodic pulse amplitude. The third cathodic pulse may have a third cathodic pulse amplitude. A ratio of the third anodic pulse amplitude to the third cathodic pulse amplitude may have a second ratio value. The first ratio value may be less than or equal to the second ratio value.

According to embodiments, the recess may remain sufficiently open until the recess is substantially completely filled with conductive material. Therefore, there may be minimum voids or substantially no voids enclosed by conductive material inside the recess, such that the conductor formed of the conductive material in the recess may be substantially free of voids. Advantageously, satisfactory performance of the conductor as an interconnect member may be attained.

The above summary is related to some of many embodiments of the invention disclosed herein and is not intended to limit the scope of the invention.

DETAILED DESCRIPTION

Figure 1:
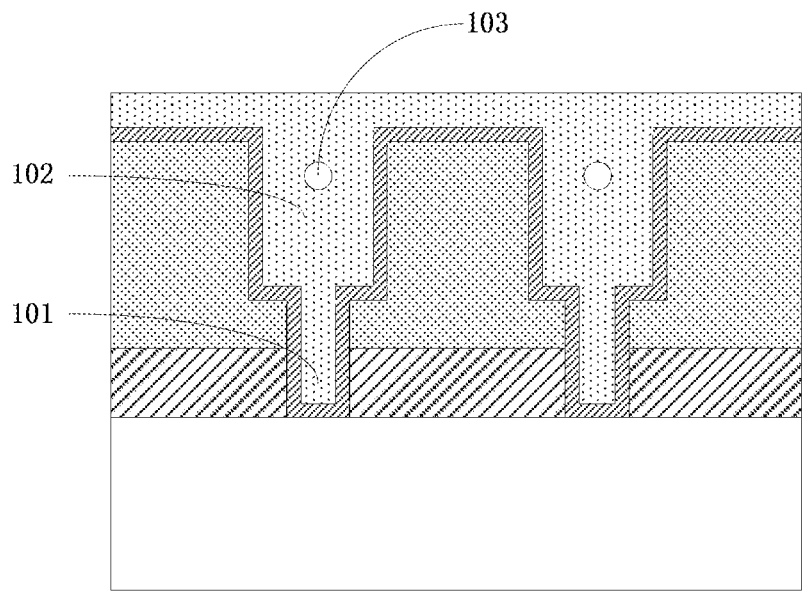
FIG. 1 shows a schematic cross-sectional view that illustrates an interconnect member.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed below may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate structure) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive". The term "electrically connected" may mean "electrically connected without any intervening transistors".

Unless explicitly described to the contrary, the word "comprise" and variations such as "comprises", "comprising", "include", or "including" may imply the inclusion of stated elements but not the exclusion of other elements.

One or more the electrical connections described in this application may be connected through no intervening transistor.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

Figure 2:
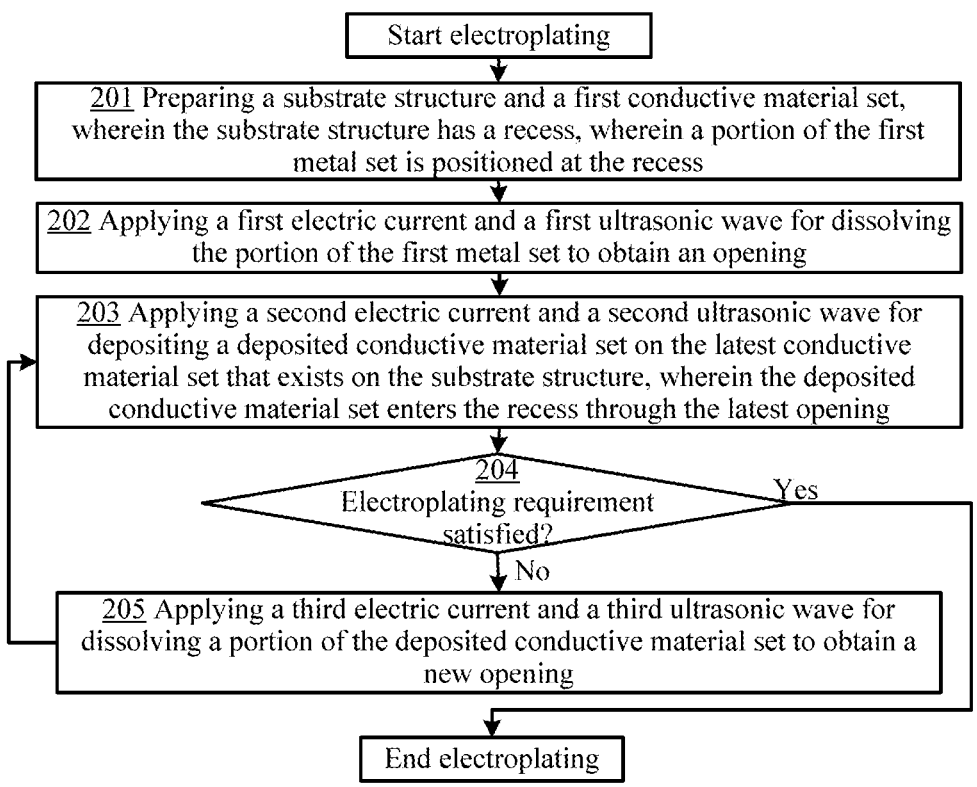
FIG. 2 shows a schematic flowchart that illustrates a method for manufacturing a conductor in accordance with one or more embodiments.
Figure 3A:
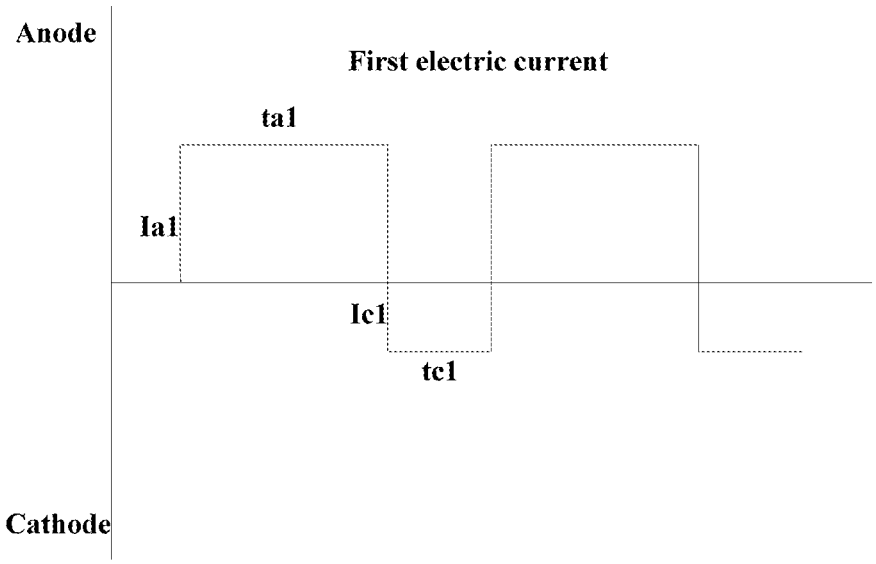
FIG. 3A shows a schematic diagram that illustrates a first-type electric current (or first electric current) used in a method for manufacturing a conductor in accordance with one or more embodiments.
Figure 3B:
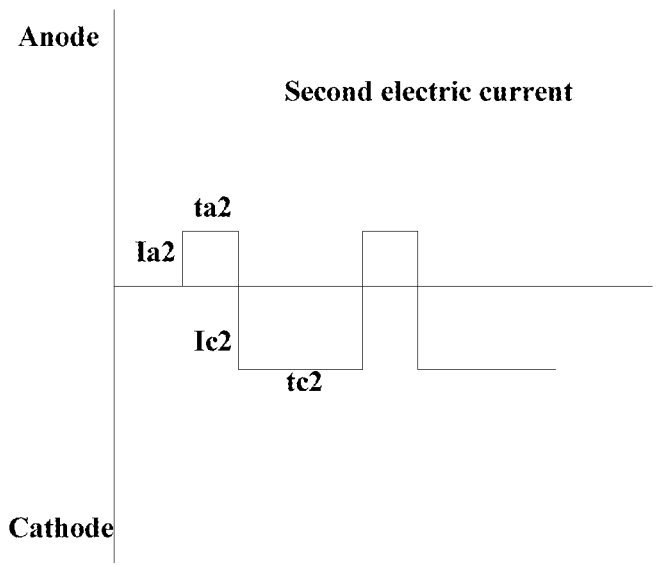
FIG. 3B shows a schematic diagram that illustrates a second-type electric current (or second electric current) used in a method for manufacturing a conductor in accordance with one or more embodiments.
Figure 3C:
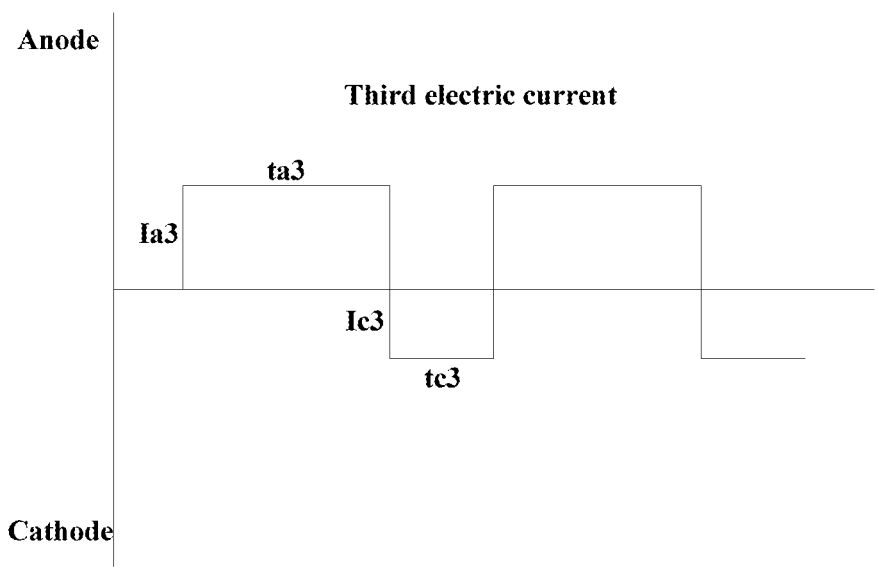
FIG. 3C shows a schematic diagram that illustrates a third-type electric current (or third electric current) used in a method for manufacturing a conductor in accordance with one or more embodiments.

FIG. 2 shows a schematic flowchart that illustrates a method for manufacturing a conductor in accordance with one or more embodiments. The conductor may be used as an interconnect member in an integrated circuit and/or a printed circuit board. FIG. 3A shows a schematic diagram that illustrates a first-type electric current (or first electric current) used in a method for manufacturing a conductor in accordance with one or more embodiments. FIG. 3B shows a schematic diagram that illustrates a second-type electric current (or second electric current) used in a method for manufacturing a conductor in accordance with one or more embodiments. FIG. 3C shows a schematic diagram that illustrates a third-type electric current (or third electric current) used in a method for manufacturing a conductor in accordance with one or more embodiments. FIG. 4A, FIG. 4B, FIG. 4C, FIG. 4D, FIG. 4E, FIG. 4F, and FIG. 4G show schematic cross-sectional diagrams that illustrates structures formed in a method for manufacturing a conductor in accordance with one or more embodiments.

The structures illustrated in FIG. 4A, FIG. 4B, FIG. 4C, FIG. 4D, and FIG. 4E and a conductive material source may be positioned (e.g., immersed) in a solution that is suitable for electroplating processes in the method. The conductive material source may be formed of, for example, a metal, such as at least one of copper, nickel, silver, and aluminum. The solution may include at least one of $CuSO_4$ and $Cu_3(PO_4)_2$, and the conductive material source may be formed of copper. In electroplating processes in the method, the conductive material source may be an anode, and the substrate structure 400 may be a cathode.

Referring to FIG. 2, the method may include steps 201, 202, 203, 204, and 205.

Figure 4A:
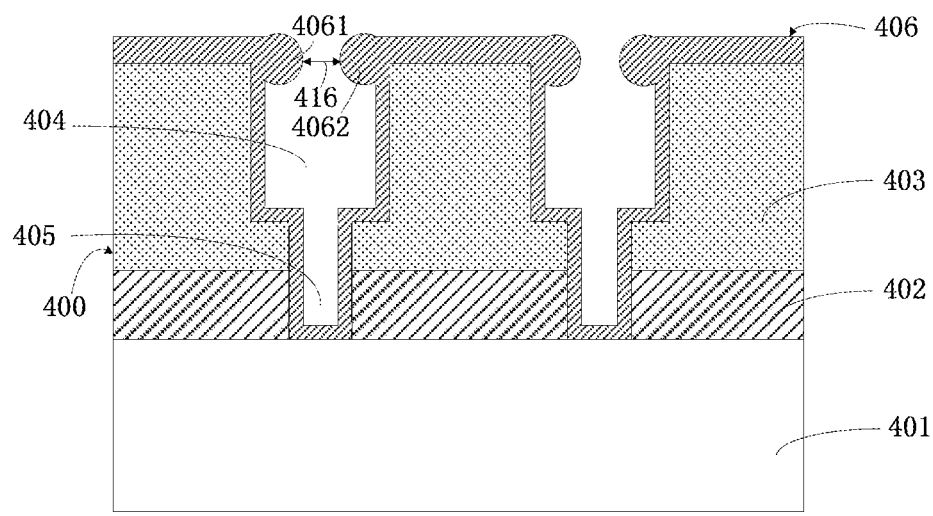
FIG. 4A, FIG. 4B, FIG. 4C, FIG. 4D, FIG. 4E, FIG. 4F, and FIG. 4G show schematic cross-sectional diagrams that illustrates structures formed in a method for manufacturing a conductor in accordance with one or more embodiments.

Referring to FIG. 2 and FIG. 4A, the step 201 may include preparing a substrate structure 400 and a conductive material set 406. The substrate structure 400 may include a substrate 401, a barrier layer 402, and a dielectric layer 403 and may have a recess. The recess may include a trench 404 and a via 405. The conductive material set 406 may be a metal seed layer and may be formed of, for example, at least one of copper, cobalt, etc. The first conductive material set 406 may extend into the recess. A portion 4061 of the conductive material set 406 and/or a portion 4062 of the conductive material set 406 may be positioned at the recess. The portion 4061 and the portion 4062 may be respectfully positioned at two opposite edges of the recess. A gap 416 may exist between the portion 4061 and the portion 4062.

Figure 4B:
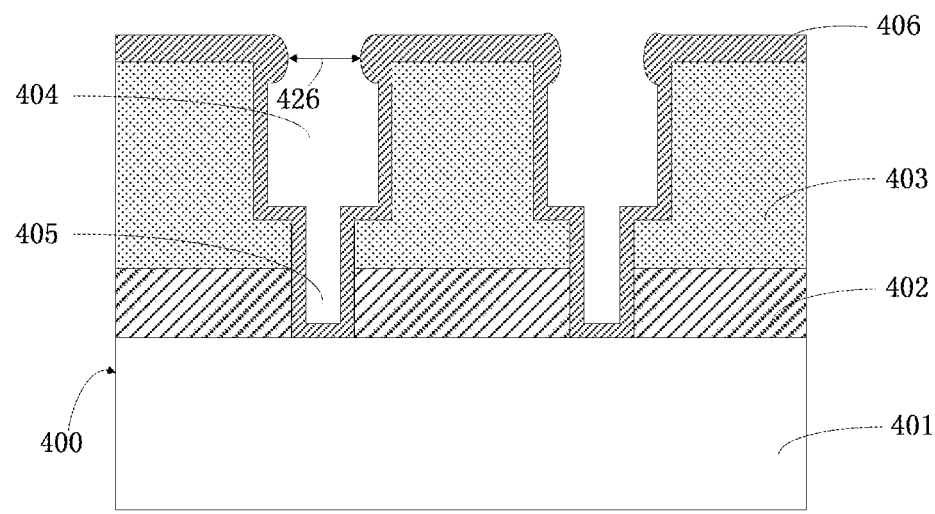

Referring to FIG. 2, FIG. 4A, and FIG. 4B, the step 202 may include applying a first-type electric current (or first electric current) and a first-type ultrasonic wave (or first ultrasonic wave) for dissolving the portion 4061 and/or the portion 4062 to obtain an opening 426. The opening 426 may be wider than the gap 416 in a direction parallel to (e.g., a bottom surface of) the substrate structure 400.

The first electric current may flow between the substrate structure 400 and the conductive material source for facilitating deposition and/or dissolution of conductive material. The first ultrasonic wave may be applied to the solution for facilitating dissolution and distribution of conductive material. The first electric current and the first ultrasonic wave may be applied for a first time duration. The first time duration may be in a range of 1 second to 10 seconds. An electric current density of the first electric current may be in a range of 0.001 A/cm$^2$ to 5 A/cm$^2$. A frequency of the first ultrasonic wave may be in a range of 1000 Hz to 5000 Hz. A power of the first ultrasonic wave may be in a range of 10 W to 5000 W.

Referring to FIG. 3A, the first electric current may have first-type anodic pulses (or first anodic pulses) and first-type cathodic pulses (or first cathodic pulses). Anodic pulses may promote dissolution of conductive material that has been deposited on the substrate structure 400. Cathodic pulse may promote deposition of conductive material on the substrate structure 400. Each first anodic pulse may have an anodic pulse width ta1 (or anodic pulse time duration ta1). Each first cathodic pulse may have a cathodic pulse width tc1. A ratio of the anodic pulse width ta1 to the cathodic pulse width tc1 may have a ratio value ta1/tc1. The ratio value ta1/tc1 may be in a range of 20/1 to 1/1. Each first anodic pulse may have an anodic pulse amplitude Ia1. Each first cathodic pulse may have a cathodic pulse amplitude Ic1. A ratio of the anodic pulse amplitude Ia1 to the cathodic pulse amplitude Ic1 may have a ratio value Ia1/Ic1. The ratio value Ia1/Ic1 may be 1/1. Since the ratio value ta1/tc1 may be greater than 1 and the ratio value Ia1/Ic1 may be equal to 1, a conductive material dissolution rate of may be greater than a conductive material deposition rate when the first electric current and the first ultrasonic wave are applied in the step 202.

Figure 4C:
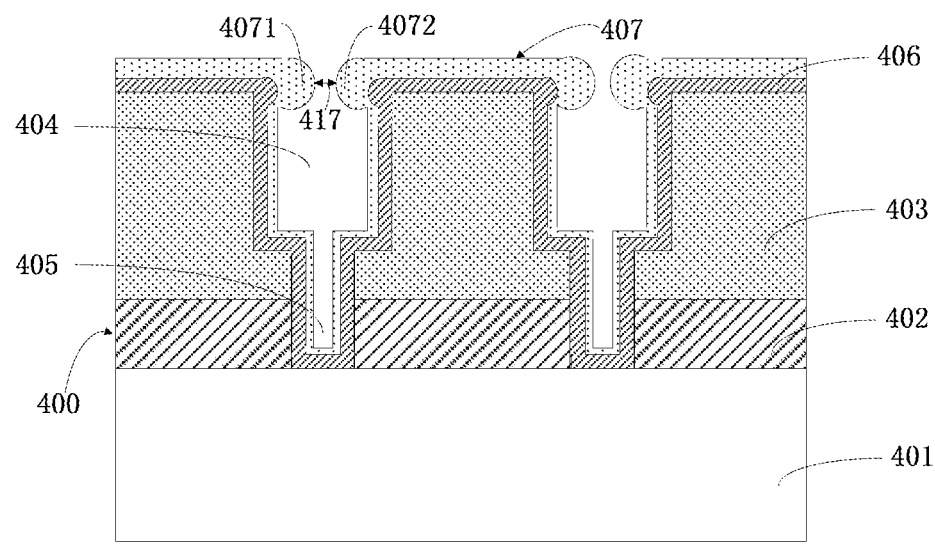

Referring to FIG. 2, FIG. 4B, and FIG. 4C, the step 203 may include applying a second-type electric current (or second electric current) and a second-type ultrasonic wave (or second ultrasonic wave) for depositing a deposited conductive material set, e.g., a conductive material set 407, on the conductive material set, e.g., the conductive material set 406, that already exists on the substrate structure 400. The conductive material set 407 may be formed of a metal material, such as at least one of copper, nickel, silver, and aluminum. The conductive material set 407 may extend into the recess through the opening 426. A portion 4071 of the conductive material set 407 and/or a portion 4072 of the conductive material set 407 may be positioned at a position of the opening 426. The portion 4071 and the portion 4072 may be respectfully positioned at two positions that respectively correspond to two opposite edges of the opening 426. If the recess is not completely filled in the step 203, a gap 417 may exist between the portion 4071 and the portion 4072. The gap 417 may be narrower than the opening 426 in the direction parallel to (e.g., a bottom surface of) the substrate structure 400.

The second electric current may flow between the substrate structure 400 and the conductive material source for facilitating deposition and/or dissolution of conductive material. The second ultrasonic wave may be applied to the solution for facilitating dissolution and distribution of conductive material. The second electric current and the second ultrasonic wave may be applied for a second time duration. The second time duration may be longer than the aforementioned first time duration, for which the first electric current and the first ultrasonic wave are applied. The second time duration may be in a range of 1 second to 600 seconds.

An electric current density of the second electric current may be in a range of 0.01 A/cm$^2$ to 20 A/cm$^2$. The electric current density of the second electric current may be greater than the electric current density of the first electric current. Therefore, a conductive material deposition rate in the step 203 may be greater than a conductive material deposition rate in the step 202.

A frequency of the second ultrasonic wave may be in a range of 1000 Hz to 5000 Hz. A power of the second ultrasonic wave may be in a range of 10 W to 5000 W. The second ultrasonic wave may continue from the first ultrasonic wave without interruption between the first ultrasonic wave and the second ultrasonic wave. The frequency of the second ultrasonic wave may be equal to the frequency of the first ultrasonic wave. The power of the second ultrasonic wave may be equal to the power of the first ultrasonic wave. Therefore, the effects of the ultrasonic waves may be substantially consistent.

Referring to FIG. 3B, the second electric current may have second-type anodic pulses (or second anodic pulses) and second-type cathodic pulses (or second cathodic pulses). Each second anodic pulse may have an anodic pulse width ta2 (or anodic pulse time duration ta2). Each second cathodic pulse may have a cathodic pulse width tc2. A ratio of the anodic pulse width ta2 to the cathodic pulse width tc2 may have a ratio value ta2/tc2. The ratio value ta2/tc2 may be less than 1, such as 1/20. Each second anodic pulse may have an anodic pulse amplitude Ia2. Each second cathodic pulse may have a cathodic pulse amplitude Ic2. A ratio of the anodic pulse amplitude Ia2 to the cathodic pulse amplitude Ic2 may have a ratio value Ia2/Ic2. The ratio value Ia2/Ic2 may be less than or equal to 1, e.g., in a range of 1/1 to 1/10. Therefore, a conductive material deposition rate may be greater than a conductive material dissolution rate when the second electric current and the second ultrasonic wave are applied in the step 203.

The ratio value ta2/tc2 may be less than the ratio value ta1/tc1. The ratio value Ia2/Ic2 may be less than or equal to the ratio value Ia1/Ic1. Therefore, the conductive material deposition rate in the step 203 may be greater than the conductive material deposition rate in the step 202.

Referring to FIG. 2, the step 204 may include determining whether a requirement related to the electroplating processes have been satisfied. For example, the step 204 may include determining whether a top portion of the recess (which includes the trench 404 and the via 405) has been filled with conductive material, determining whether the conductive material in the recess has reached a predetermined thickness (or height), and/or determining whether a predetermined number of electroplating iterations have been performed. The predetermined number of electroplating iterations may be in a range of 1 to 20. If the requirement has been satisfied, no more electric currents should be further applied between the substrate structure 400 and the conductive material source, such that no further electroplating is performed on the substrate structure 400. If the requirement has not been satisfied, the step 205 may be performed.

Figure 4D:
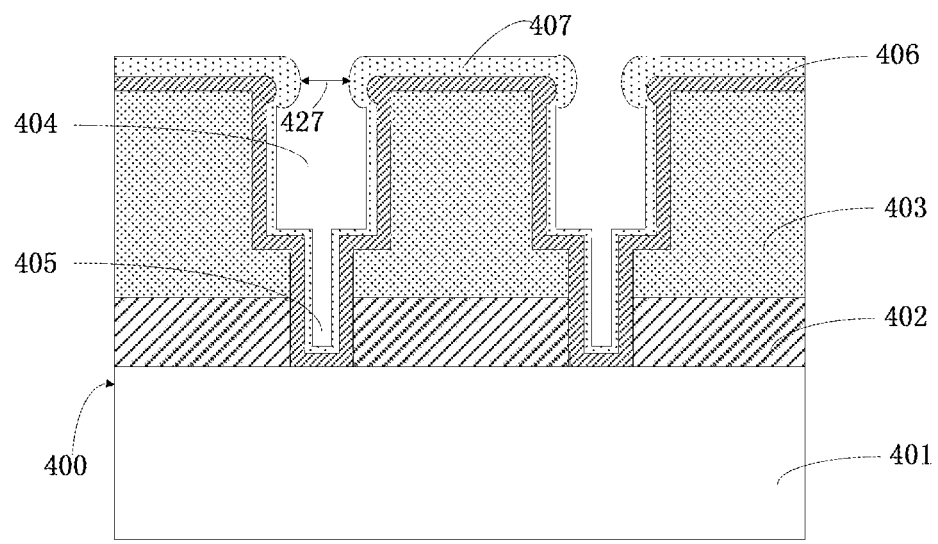

Referring to FIG. 2, FIG. 4C, and FIG. 4D, the step 205 may include applying a third electric current and a third ultrasonic wave for dissolving a portion of the conductive material set deposited in the step 203, e.g., the portion 4071 and/or the portion 4072 of the conductive material set 407, to obtain an opening, e.g., opening 427. The opening 427 may be wider than the gap 417 in the direction parallel to (e.g., a bottom surface of) the substrate structure 400.

The third electric current may flow between the substrate structure 400 and the conductive material source for facilitating deposition and/or dissolution of conductive material. The third ultrasonic wave may be applied to the solution for facilitating dissolution and distribution of conductive material. The third electric current and the third ultrasonic wave may be applied for a third time duration. The third time duration may be longer than the aforementioned first time duration, for which the first electric current and the first ultrasonic wave are applied, and/or may be longer than the aforementioned second time duration, for which the second electric current and the second ultrasonic wave are applied, for ensuring the recess remains open for receiving conductive material without closing voids inside conductive material. The third time duration may be in a range of 1 second to 1000 seconds.

An electric current density of the third electric current may be in a range of 0.001 A/cm$^2$ to 10 A/cm$^2$. The electric current density of the third electric current may be less than the electric current density of the second electric current. Therefore, a conductive material deposition rate in the step 205 may be less than the conductive material deposition rate in the step 203.

A frequency of the third ultrasonic wave may be in a range of 1000 Hz to 5000 Hz. A power of the third ultrasonic wave may be in a range of 10 W to 5000 W. The third ultrasonic wave may continue from the second ultrasonic wave without interruption between the second ultrasonic wave and the third ultrasonic wave. The frequency of the third ultrasonic wave may be equal to the frequency of the second ultrasonic wave. The power of the third ultrasonic wave may be equal to the power of the second ultrasonic wave. Therefore, the effects of the ultrasonic waves may be substantially consistent.

Referring to FIG. 3C, the third electric current may have third-type anodic pulses (or third anodic pulses) and third-type cathodic pulses (or third cathodic pulses). Each third anodic pulse may have an anodic pulse width ta3 (or anodic pulse time duration ta3). Each third cathodic pulse may have a cathodic pulse width tc3. A ratio of the anodic pulse width ta3 to the cathodic pulse width tc3 may have a ratio value ta3/tc3. The ratio value ta3/tc3 may be greater than or equal to 1, e.g., in a range of 20/1 to 1/1. Each third anodic pulse may have an anodic pulse amplitude Ia3. Each third cathodic pulse may have a cathodic pulse amplitude Ic3. A ratio of the anodic pulse amplitude Ia3 to the cathodic pulse amplitude Ic3 may have a ratio value Ia3/Ic3. The ratio value Ia3/Ic3 may be greater than or equal to 1, e.g., in a range of 10/1 to 1/1. Therefore, a conductive material dissolution rate may be greater than a conductive material deposition rate when the third electric current and the third ultrasonic wave are applied in the step 205.

The ratio value ta3/tc3 may be greater than the ratio value ta2/tc2 and may be equal to the ratio value ta1/tc1. The ratio value Ia3/Ic3 may be greater than the ratio value Ia2/Ic2 and may be greater than or equal to the ratio value Ia1/Ic1. Therefore, the conductive material deposition rate in the step 203 may be greater than the conductive material deposition rate in the step 205; the conductive material dissolution rate in the step 205 may be greater than the conductive material dissolution rate in the step 203; and the conductive material dissolution rate in the step 205 may be greater than or equal to the conductive material dissolution rate in the step 202. The portion 4061 of the conductive material set 406 may be dissolved at a first dissolution rate in the step 202. The portion 4071 of the conductive material set 407 may be dissolved at a second dissolution rate in the step 205. The second dissolution rate may be greater than the first dissolution rate.

Figure 4E:
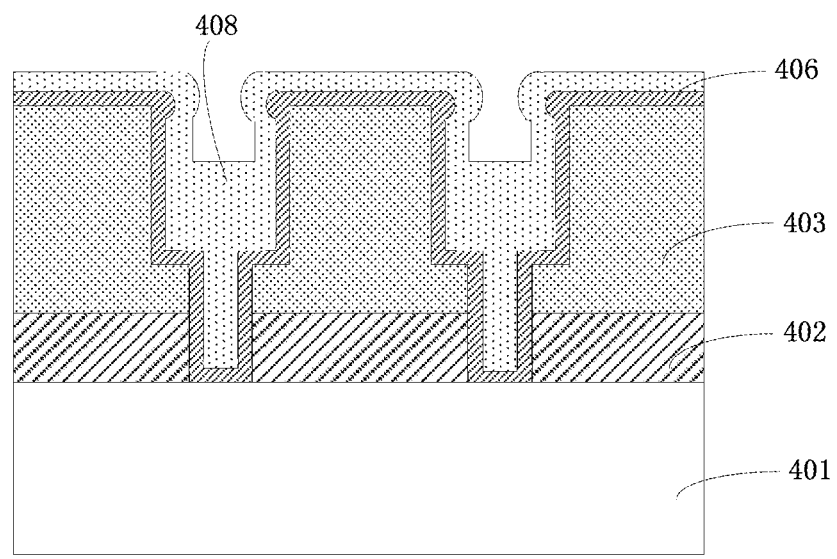

Referring to FIG. 2, FIG. 4D, and FIG. 4E, the step 203 may be performed subsequent to the step 205, such that a next conductive material set 408 may be provided through the opening 427 into the recess. The step 205, the step 203, and the step 204 may be iterated (e.g., up to 20 times) until the electroplating requirement is determined to be satisfied in the step 204. In the iterations, second electric currents (i.e., second-type electric currents) and third electric currents (i.e., third-type electric currents) may be alternately applied when second ultrasonic waves (i.e., second-type ultrasonic waves) and/or third ultrasonic waves (i.e., third-type ultrasonic waves) are continuously and/or alternately applied.

Figure 4F:
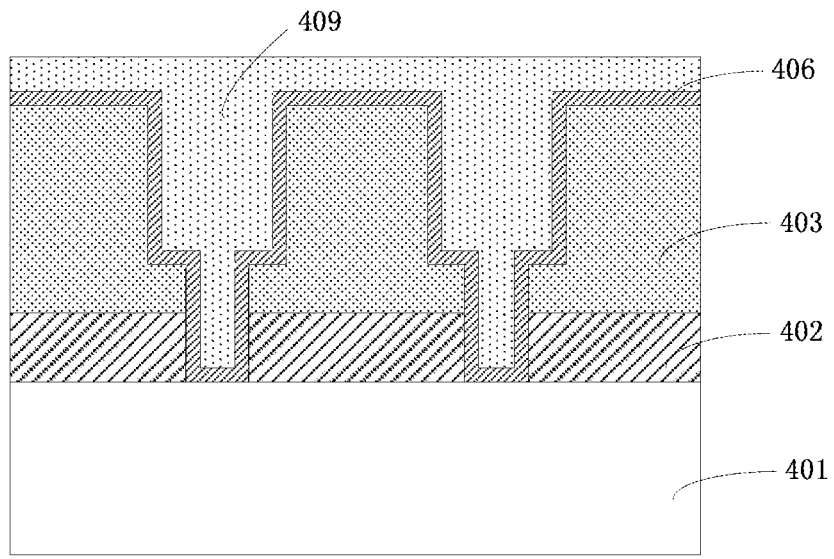

Referring to FIG. 2, FIG. 4E, and FIG. 4F, electroplating on the substrate structure 400 may end when the recess (which includes the trench 404 and the via 405) has been completely filled by the conductive material set 406 and an accumulated conductive material set 409, and/or when a predetermined number of electroplating iterations have been performed. The accumulated conductive material set 409 may be a result of iterations of alternately performing the step 203 and the step 205.

Figure 4G:
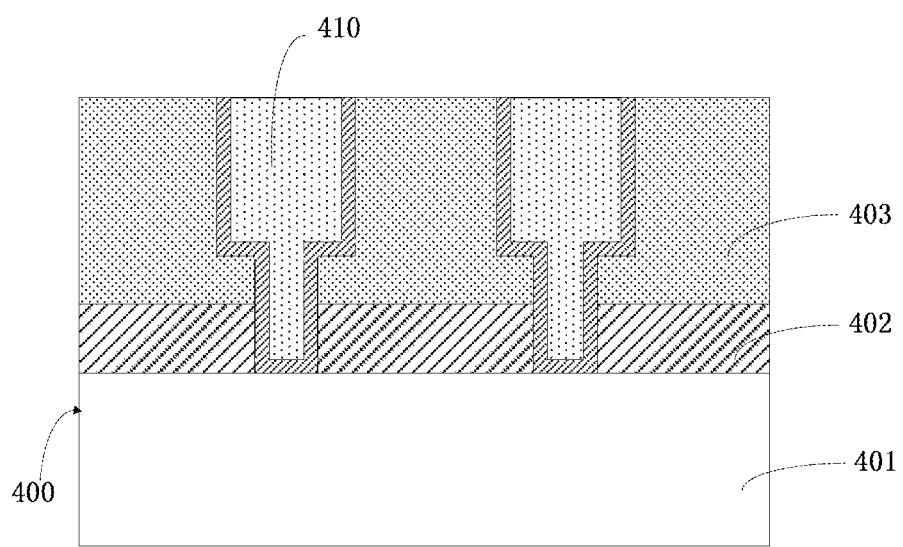

Referring to FIG. 4F and FIG. 4G, a planarization process may be performed on the accumulated conductive material set 409 and the conductive material set 406 until a surface of the dielectric layer 403 has been exposed and/or until a predetermined conductor thickness (or height) has been attained. As a result, a conductor 410 may be formed in the recess (which includes the trench 404 and the via 405). Since the recess may remain sufficiently open until the recess is substantially completely filled with conductive material, there may be minimum voids or substantially no voids enclosed by conductive material in the recess, such that the conductor 410 may be substantially free of voids. Advantageously, satisfactory performance of the conductor 410 as an interconnect member may be attained.

Additional dielectric layers and conductors (i.e., interconnect members) may be formed above the dielectric layer 403 and the conductor 410 using the method discussed with reference to one or more of FIG. 2, FIG. 3A, FIG. 3B, FIG. 4C, FIG. 4A, FIG. 4B, FIG. 4C, FIG. 4D, FIG. 4E, FIG. 4F, and FIG. 4G.

FIG. 5A, FIG. 5B, FIG. 5C, FIG. 5D, and FIG. 5E show schematic cross-sectional diagrams that illustrates structures formed in a method for manufacturing the substrate structure 400 (illustrated in FIG. 4G) prior to manufacturing the conductor 410 (illustrated in FIG. 4G) in accordance with one or more embodiments.

Figure 5A:
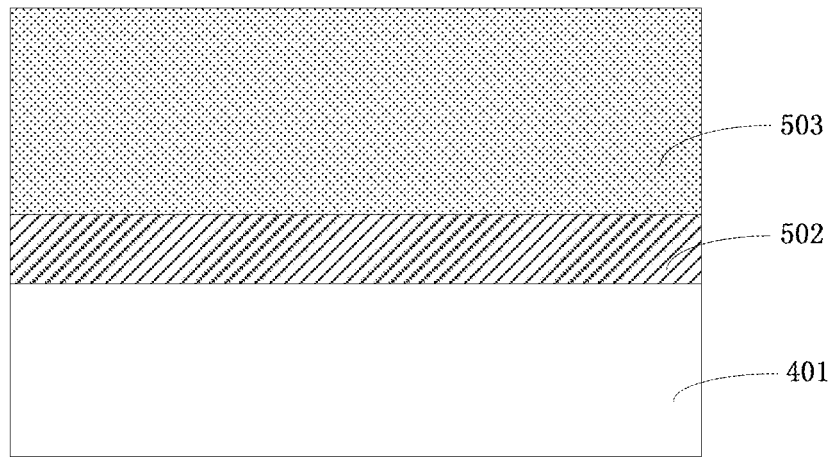
FIG. 5A, FIG. 5B, FIG. 5C, FIG. 5D, and FIG. 5E show schematic cross-sectional diagrams that illustrates structures formed in a method for manufacturing a conductor in accordance with one or more embodiments.

Referring to FIG. 5A, the method may include the following steps: preparing the substrate 401; forming a barrier material layer 502 on the substrate 401; and forming a dielectric material layer 503 on the barrier material layer 502. The substrate 401 may be a semiconductor substrate, such as one or more of a silicon substrate, a silicon-on-insulator substrate, etc. The substrate 401 may include various structures, such as one more of a gate structure, a shallow trench isolation structure, an interconnect structure, etc. The barrier material layer 502 may include one or more of a tantalum (Ta) layer, a tantalum nitride (TaN) layer, etc.

The dielectric material layer 503 may be or may include a low-k dielectric material layer, such as a porous low-k dielectric material layer.

Figure 5B:
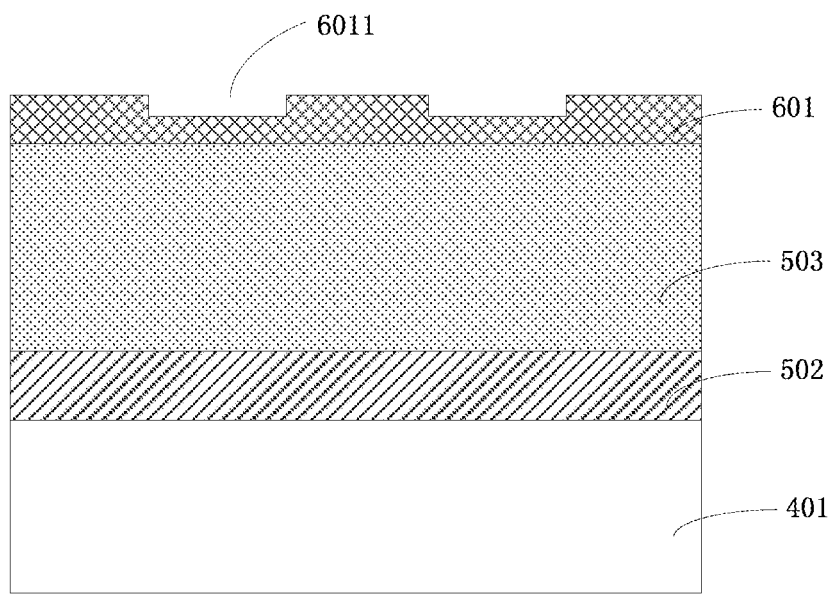

Referring to FIG. 5A and FIG. 5B, the method may include the following steps: forming a hard mask on the dielectric material layer 503; and performing lithography and/or etching on the hard mask to form a patterned hard mask 601 that has a trench 6011. The patterned hard mask 601 may be formed of a nitride of silicon ($Si_xN_y$), such as silicon nitride (SiN). The trench 6011 may define a position and/or a width of the subsequently formed trench 404.

Figure 5C:
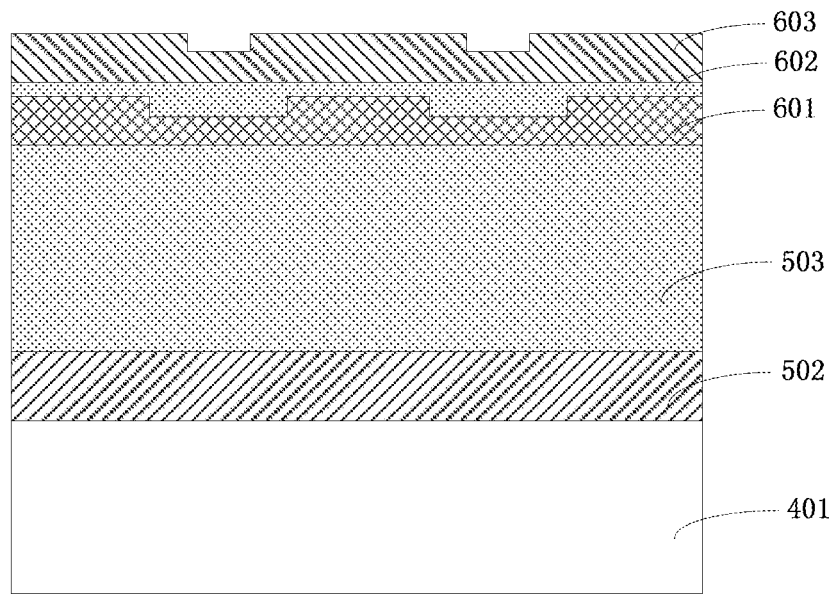

Referring to FIG. 5B and FIG. 5C, the method may include the following steps: forming an anti-reflection layer 602 on the patterned hard mask 601; and forming a patterned photoresist 603 on the anti-reflection layer 602. The anti-reflection layer 602 may be unnecessary in an embodiment. The patterned photoresist 603 may have trenches for defining a position and a width of the subsequently formed via 405.

Figure 5D:
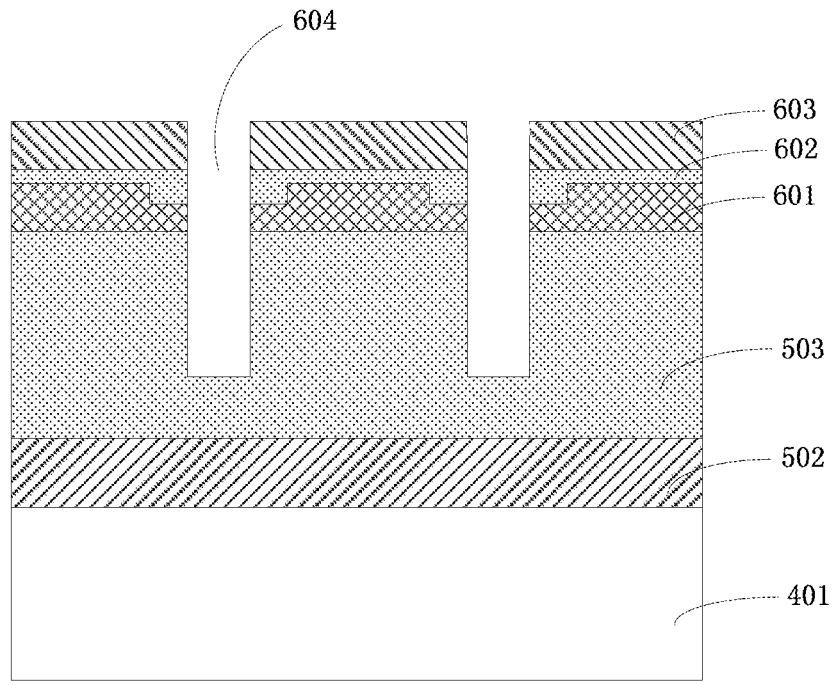

Referring to FIG. 5C and FIG. 5D, the method may include the following step: etching (using the patterned photoresist 603 as a mask) the anti-reflection layer 602, the patterned hard mask 601, and the dielectric material layer 503 to form a hole 604. In an embodiment, the hole 04 may extend to the barrier material layer 502 and/or may penetrate the barrier material layer 502.

Figure 5E:
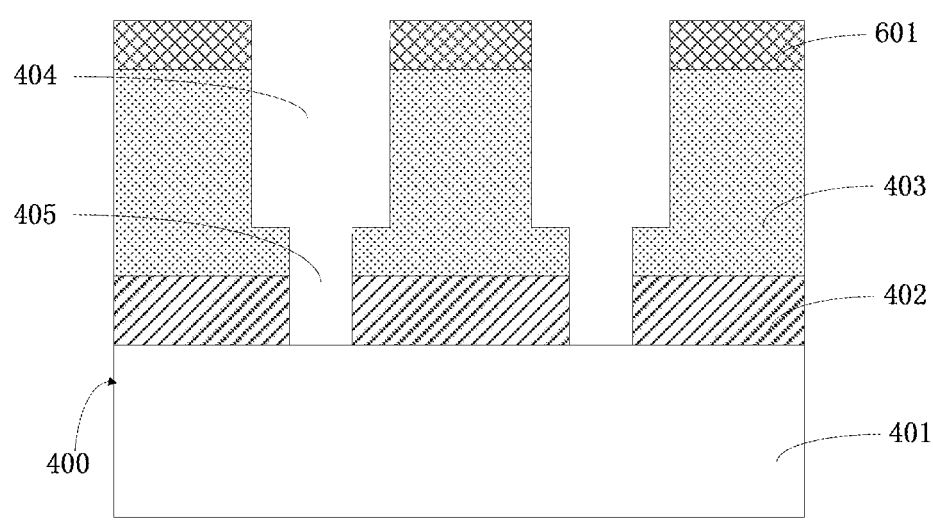

Referring to FIG. 5D and FIG. 5E, the method may include the following steps: removing the patterned photoresist 603 and the anti-reflection layer 602; etching (using the patterned hard mask 601 as a mask) the dielectric material layer 503 and the barrier material layer 502 to form the substrate structure 400, which has the dielectric layer 403, the barrier layer 402, the trench 404, and the via 405 positioned on the substrate 401. Subsequently, the patterned hard mask 601 may be removed. Referring to FIG. 4A, a physical vapor deposition (PVD) process may be performed to form the conductive material set 406 on the substrate structure 400. In an embodiment, a diffusion barrier may be formed on inner walls of the trench 404 and the via 405 before the formation of the conductive material set 406. The diffusion barrier may include one or more of a tantalum (Ta) layer and a tantalum nitride (TaN) layer.

In an embodiment, the substrate structure 400 may be or may include a printed circuit board, which may be alternative to or in addition to a semiconductor substrate structure.

According to embodiments, the recess may remain sufficiently open until the recess is substantially completely filled with conductive material. Therefore, there may be minimum voids or substantially no voids enclosed by conductive material inside the recess, such that the conductor formed of the conductive material in the recess may be substantially free of voids. Advantageously, satisfactory performance of the conductor as an interconnect member may be attained.

While some embodiments have been described as examples, there are alterations, permutations, and equivalents. It should also be noted that there are many alternative ways of implementing embodiments. Furthermore, embodiments may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents.

What is claimed is:

1. A method for manufacturing a conductor, the method comprising:

preparing a substrate structure and a first conductive material set, wherein the substrate structure has a recess, and wherein a first portion of the first conductive material set is positioned at the recess;

applying a first electric current and a first ultrasonic wave for dissolving the first portion of the first conductive material set to obtain a first opening;

applying a second electric current and a second ultrasonic wave for depositing a second conductive material set on the first conductive material set, wherein a first portion of the second conductive material set is positioned at a position of the first opening;

applying a third electric current and a third ultrasonic wave for dissolving the first portion of the second conductive material set to obtain a second opening; and providing a third conductive material set through the second opening into the recess.

2. The method of claim 1 comprising: applying a fourth electric current and a fourth ultrasonic wave for depositing the third conductive material set into the recess, wherein the fourth electric current is identical to the second electric current, and wherein the fourth ultrasonic wave is identical to the second ultrasonic wave.

3. The method of claim 1 comprising: alternately applying electric currents identical to the second electric current and electric currents identical to the third electric current for a plurality of iterations when continuously applying one or more ultrasonic waves identical to at least one of the second ultrasonic wave and the third ultrasonic wave.

4. The method of claim 3, wherein a number of the iterations is in a range of 1 and 20.

5. The method of claim 1, wherein the first portion of the first conductive material set is dissolved at a first dissolution rate, wherein the first portion of the second conductive material set is dissolved at a second dissolution rate, and wherein the second dissolution rate is greater than the first dissolution rate.

6. The method of claim 1, wherein when the second electric current and the second ultrasonic wave are applied, a conductive material deposition rate is greater than a conductive material dissolution rate.

7. The method of claim 1, wherein the first portion of the first conductive material set and a second portion of the first conductive material set are respectfully positioned at two opposite edges of the recess, wherein a gap exists between the first portion of the first conductive material set and the second portion of the first conductive material set, and wherein the first opening is wider than the gap in a direction parallel to the substrate structure.

8. The method of claim 1, wherein the first portion of the second conductive material set and a second portion of the second conductive material set are respectfully positioned at two positions that respectively correspond to two opposite edges of the first opening, wherein a gap exists between the first portion of the second conductive material set and the second portion of the second conductive material set, and wherein the second opening is wider than the gap in a direction parallel to the substrate structure.

9. The method of claim 1, wherein the second ultrasonic wave continues from the first ultrasonic wave without interruption between the first ultrasonic wave and the second ultrasonic wave, and wherein the third ultrasonic wave continues from the second ultrasonic wave with no interruption between the second ultrasonic wave and the third ultrasonic wave.

10. The method of claim 1, wherein at least one of the first ultrasonic wave, the second ultrasonic wave, and the third ultrasonic wave has a frequency that is in a range of 1000 Hz to 5000 Hz, and wherein at least one of the first ultrasonic wave, the second ultrasonic wave, and the third ultrasonic wave has a power that is in a range of 10 W to 5000 W.

11. The method of claim 1, wherein the first electric current and the first ultrasonic wave are applied for a first time duration, wherein the second electric current and the second ultrasonic wave are applied for a second time duration, and wherein the first time duration is shorter than the second time duration.

12. The method of claim 1, wherein an electric current density of the first electric current is less than an electric current density of the second electric current.

13. The method of claim 1, wherein an electric current density of the second electric current is greater than an electric current density of the third electric current.

14. The method of claim 1, wherein an electric current density of the first electric current is in a range of 0.001 A/cm$^2$ to 5 A/cm$^2$, wherein an electric current density of the second electric current is in a range of 0.01 A/cm$^2$ to 20 A/cm$^2$, and wherein an electric current density of the third electric current is in a range of 0.001 A/cm$^2$ to 10 A/cm$^2$.

15. The method of claim 1, wherein the first electric current has a first anodic pulse and a first cathodic pulse, wherein the first anodic pulse has a first anodic pulse width, wherein the first cathodic pulse has a first cathodic pulse width, wherein a ratio of the first anodic pulse width to the first cathodic pulse width has a first pulse width ratio value, wherein the second electric current has a second anodic pulse and a second cathodic pulse, wherein the second anodic pulse has a second anodic pulse width, wherein the second cathodic pulse has a second cathodic pulse width, wherein a ratio of the second anodic pulse width to the second cathodic pulse width has a second pulse width ratio value, and wherein the first pulse width ratio value is greater than the second pulse width ratio value.

16. The method of claim 1, wherein the first electric current has a first anodic pulse and a first cathodic pulse, wherein the first anodic pulse has a first anodic pulse amplitude, wherein the first cathodic pulse has a first cathodic pulse amplitude, wherein a ratio of the first anodic pulse amplitude to the first cathodic pulse amplitude has a first pulse amplitude ratio value, wherein the second electric current has a second anodic pulse and a second cathodic pulse, wherein the second anodic pulse has a second anodic pulse amplitude, wherein the second cathodic pulse has a second cathodic pulse amplitude, wherein a ratio of the second anodic pulse amplitude to the second cathodic pulse amplitude has a second pulse amplitude ratio value, and wherein the first pulse width ratio value is greater than or equal to the second pulse width ratio value.

17. The method of claim 1, wherein the second electric current has a second anodic pulse and a second cathodic pulse, wherein the second anodic pulse has a second anodic pulse width, wherein the second cathodic pulse has a second cathodic pulse width, wherein a ratio of the second anodic pulse width to the second cathodic pulse width has a first ratio value, wherein the third electric current has a third anodic pulse and a third cathodic pulse, wherein the third anodic pulse has a third anodic pulse width, wherein the third cathodic pulse has a third cathodic pulse width, wherein a ratio of the third anodic pulse width to the third cathodic pulse width has a second ratio value, and wherein the first ratio value is less than the second ratio value.

18. The method of claim 1, wherein the second electric current has a second anodic pulse and a second cathodic pulse, wherein the second anodic pulse has a second anodic pulse amplitude, wherein the second cathodic pulse has a second cathodic pulse amplitude, wherein a ratio of the second anodic pulse amplitude to the second cathodic pulse amplitude has a first ratio value, wherein the third electric current has a third anodic pulse and a third cathodic pulse, wherein the third anodic pulse has a third anodic pulse amplitude, wherein the third cathodic pulse has a third cathodic pulse amplitude, wherein a ratio of the third anodic pulse amplitude to the third cathodic pulse amplitude has a second ratio value, and wherein the first ratio value is less than or equal to the second ratio value.

19. The method of claim 1, wherein the first electric current has a first anodic pulse and a first cathodic pulse, wherein the first anodic pulse has a first anodic pulse width, wherein the first cathodic pulse has a first cathodic pulse width, wherein a ratio of the first anodic pulse width to the first cathodic pulse width has a first ratio value, wherein the third electric current has a third anodic pulse and a third cathodic pulse, wherein the third anodic pulse has a third anodic pulse width, wherein the third cathodic pulse has a third cathodic pulse width, wherein a ratio of the third anodic pulse width to the third cathodic pulse width has a second ratio value, and wherein the first ratio value is equal to the second ratio value.

20. The method of claim 1, wherein the first electric current has a first anodic pulse and a first cathodic pulse, wherein the first anodic pulse has a first anodic pulse amplitude, wherein the first cathodic pulse has a first cathodic pulse amplitude, wherein a ratio of the first anodic pulse amplitude to the first cathodic pulse amplitude has a first ratio value, wherein the third electric current has a third anodic pulse and a third cathodic pulse, wherein the third anodic pulse has a third anodic pulse amplitude, wherein the third cathodic pulse has a third cathodic pulse amplitude, wherein a ratio of the third anodic pulse amplitude to the third cathodic pulse amplitude has a second ratio value, and wherein the first ratio value is less than or equal to the second ratio value.

* * * * *